United States Patent
Yamamoto et al.

(10) Patent No.: US 11,079,093 B2
(45) Date of Patent: Aug. 3, 2021

(54) LIGHT EMITTING DEVICE, DISPLAY DEVICE, AND LIGHTING DEVICE

(71) Applicant: Saturn Licensing LLC, New York, NY (US)

(72) Inventors: Takeshi Yamamoto, Tokyo (JP); Tomoyuki Yoshimatsu, Kanagawa (JP); Soya Araki, Kanagawa (JP); Naoki Tanaka, Chiba (JP)

(73) Assignee: Saturn Licensing LLC, New York, NY (US)

( * ) Notice: Subject to any disclaimer, the term of this patent is extended or adjusted under 35 U.S.C. 154(b) by 0 days.

(21) Appl. No.: 16/334,908

(22) PCT Filed: Jul. 25, 2017

(86) PCT No.: PCT/JP2017/026861
§ 371 (c)(1),
(2) Date: Mar. 20, 2019

(87) PCT Pub. No.: WO2018/066209
PCT Pub. Date: Apr. 12, 2018

(65) Prior Publication Data
US 2019/0285246 A1    Sep. 19, 2019

(30) Foreign Application Priority Data

Oct. 7, 2016    (JP) .............................. JP2016-198773

(51) Int. Cl.
*F21V 7/05*    (2006.01)
*G02B 5/02*    (2006.01)
(Continued)

(52) U.S. Cl.
CPC .............. *F21V 7/05* (2013.01); *F21S 2/00* (2013.01); *G02B 5/0205* (2013.01);
(Continued)

(58) Field of Classification Search
CPC ....... F21V 7/0083; G02F 2001/133614; G02F 1/133603; G02F 1/133605;
(Continued)

(56) References Cited

U.S. PATENT DOCUMENTS 7,635,194 B2 * 12/2009 Kim .................. G02F 1/133603
362/561
7,726,828 B2 * 6/2010 Sato .................... G02B 6/0043
362/341
(Continued)

FOREIGN PATENT DOCUMENTS

| JP | 2005038776 A | 2/2005 |
|---|---|---|
| JP | 2006080334 A | 3/2006 |

(Continued)

OTHER PUBLICATIONS

International Search Report corresponding to PCT/JP2017/026861, dated Oct. 24, 2017 (3 pgs.).

*Primary Examiner* — Alexander K Garlen
*Assistant Examiner* — Colin J Cattanach
(74) *Attorney, Agent, or Firm* — Lerner, David, Littenberg, Krumholz & Mentlik, LLP

(57) ABSTRACT

A light emitting device includes: a light emitting element; a reflection wall that surrounds the light emitting element; and a diffusion reflection sheet that includes a plurality of particles and permits entrance of emitted light from the light emitting element and reflected light from the reflection wall.

16 Claims, 14 Drawing Sheets

(51) Int. Cl.

| | | |
|---|---|---|
| *G02B 27/09* | (2006.01) | |
| *H01L 33/50* | (2010.01) | |
| *H01L 33/60* | (2010.01) | |
| *G02F 1/13357* | (2006.01) | |
| *F21S 2/00* | (2016.01) | |
| *H01L 33/58* | (2010.01) | |
| *F21V 7/00* | (2006.01) | |
| *G02F 1/1335* | (2006.01) | |

(52) U.S. Cl.
CPC ... *G02B 27/0977* (2013.01); *G02F 1/133605* (2013.01); *G02F 1/133606* (2013.01); *H01L 33/50* (2013.01); *H01L 33/58* (2013.01); *H01L 33/60* (2013.01); *F21V 7/0083* (2013.01); *G02F 1/133601* (2021.01); *G02F 1/133602* (2013.01); *G02F 1/133603* (2013.01); *G02F 1/133614* (2021.01); *G02F 2202/10* (2013.01)

(58) Field of Classification Search
CPC ......... G02F 1/133606; G02F 1/133607; G02F 1/133609; G02F 1/133611
See application file for complete search history.

(56) References Cited

U.S. PATENT DOCUMENTS

| | | | | |
|---|---|---|---|---|
| 9,297,519 | B2* | 3/2016 | Lee | G02B 19/0071 |
| 9,874,322 | B2* | 1/2018 | Edmond | F21S 8/026 |
| 10,162,219 | B2* | 12/2018 | Yeo | G02F 1/133605 |
| 2006/0105483 | A1* | 5/2006 | Leatherdale | H01L 33/56 438/26 |
| 2006/0221611 | A1* | 10/2006 | Noh | G02F 1/133603 362/247 |
| 2006/0221612 | A1* | 10/2006 | Song | G02F 1/133603 362/247 |
| 2007/0052663 | A1* | 3/2007 | Kim | G02F 1/133605 345/102 |
| 2007/0070625 | A1* | 3/2007 | Bang | G02F 1/133603 362/240 |
| 2007/0146297 | A1 | 6/2007 | Bang | |
| 2007/0159849 | A1* | 7/2007 | Sakai | G02F 1/133603 362/612 |
| 2008/0037279 | A1* | 2/2008 | Chan | G02F 1/133603 362/612 |
| 2008/0047181 | A1* | 2/2008 | Sakai | G09F 13/04 40/546 |
| 2008/0101069 | A1* | 5/2008 | Chang | G02F 1/133608 362/247 |
| 2008/0211989 | A1* | 9/2008 | Park | G02F 1/133603 349/64 |
| 2008/0303777 | A1* | 12/2008 | Inoue | G02B 3/0056 345/102 |
| 2009/0168404 | A1 | 7/2009 | Matsukawa et al. | |
| 2010/0061087 | A1* | 3/2010 | Stevens | G02F 1/133603 362/97.3 |
| 2010/0284190 | A1* | 11/2010 | Oide | F21V 7/0083 362/282 |
| 2011/0051044 | A1* | 3/2011 | Segawa | G02F 1/133606 349/64 |
| 2011/0063850 | A1* | 3/2011 | Oide | G02F 1/133603 362/296.01 |
| 2011/0193118 | A1* | 8/2011 | Oshima | H01L 33/56 257/98 |
| 2011/0292655 | A1 | 12/2011 | Ing et al. | |
| 2013/0021776 | A1* | 1/2013 | Veerasamy | F21V 7/0083 362/84 |
| 2013/0070165 | A1* | 3/2013 | Shimizu | G02B 6/0091 348/739 |
| 2013/0148036 | A1* | 6/2013 | Shimizu | H04N 5/64 348/739 |
| 2013/0169905 | A1* | 7/2013 | Ouchi | G02F 1/133603 349/67 |
| 2013/0222705 | A1* | 8/2013 | Shimizu | G02F 1/133605 348/790 |
| 2014/0307421 | A1 | 10/2014 | Lee et al. | |
| 2015/0036379 | A1* | 2/2015 | Lee | G02B 5/0226 362/606 |
| 2015/0339996 | A1* | 11/2015 | Schuck | H04N 13/334 348/58 |
| 2017/0017121 | A1* | 1/2017 | Park | G02F 1/133605 |
| 2017/0045779 | A1* | 2/2017 | Kamiyoshihara | G02F 1/133608 |
| 2017/0117445 | A1* | 4/2017 | Lee | H01L 33/58 |
| 2017/0122529 | A1* | 5/2017 | Yamada | F21V 13/14 |
| 2017/0160591 | A1* | 6/2017 | Cho | G02B 5/0257 |
| 2018/0031922 | A1* | 2/2018 | Kamada | G02F 1/133621 |
| 2018/0080625 | A1* | 3/2018 | Yamada | F21V 7/22 |
| 2018/0158983 | A1* | 6/2018 | Jang | B32B 7/12 |
| 2019/0146277 | A1* | 5/2019 | Ajichi | G02F 1/133611 362/97.2 |
| 2019/0211996 | A1* | 7/2019 | Tamura | F21V 3/02 |

FOREIGN PATENT DOCUMENTS

| | | |
|---|---|---|
| JP | 2007207752 A | 8/2007 |
| JP | 2008282744 A | 11/2008 |
| JP | 2008311026 A | 12/2008 |
| JP | 2011053543 A | 3/2011 |
| JP | 2012174371 A | 9/2012 |
| JP | 2013140703 A | 7/2013 |
| WO | 2016158369 A1 | 10/2016 |

\* cited by examiner

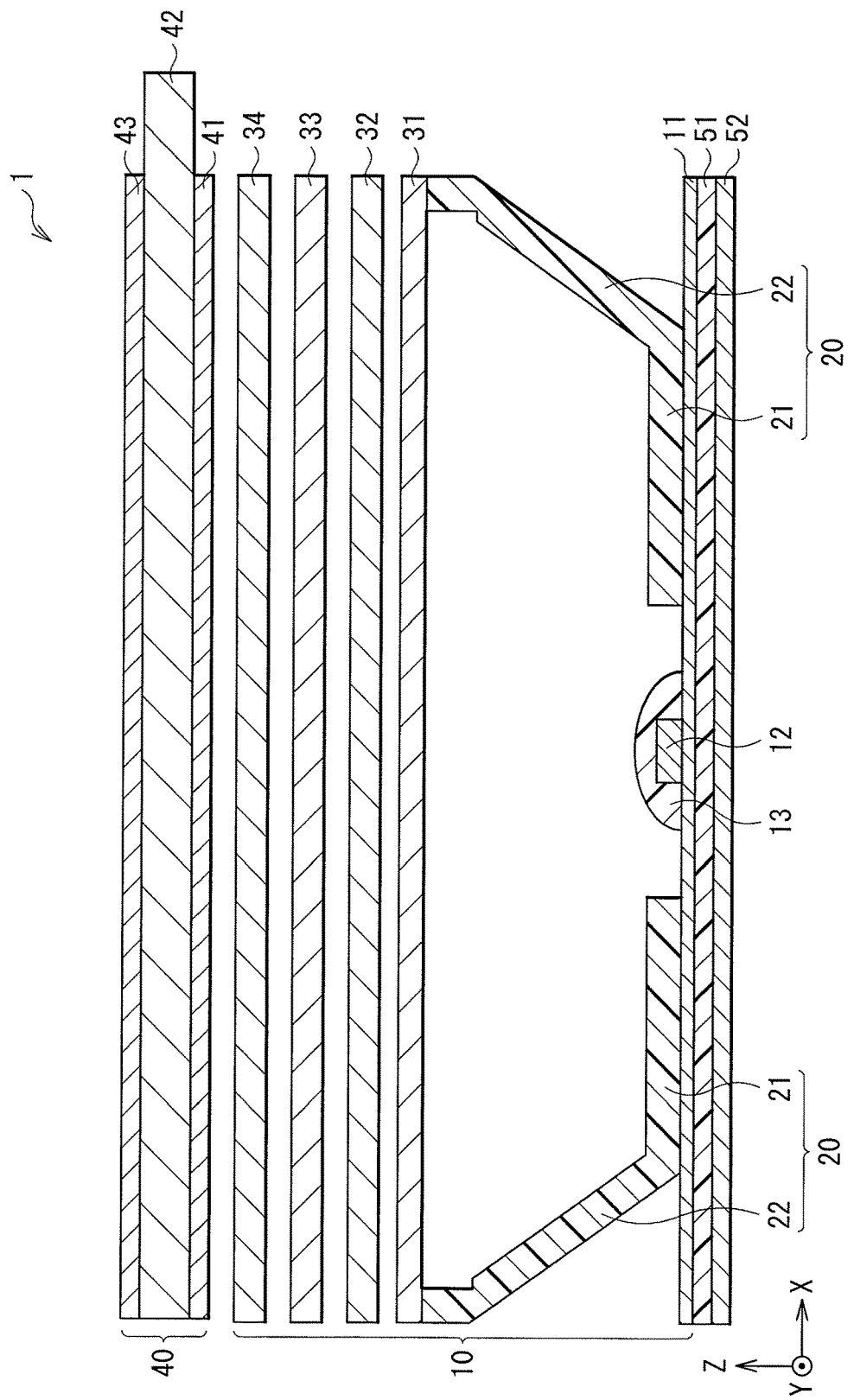
[ FIG. 1 ]

[FIG. 2]
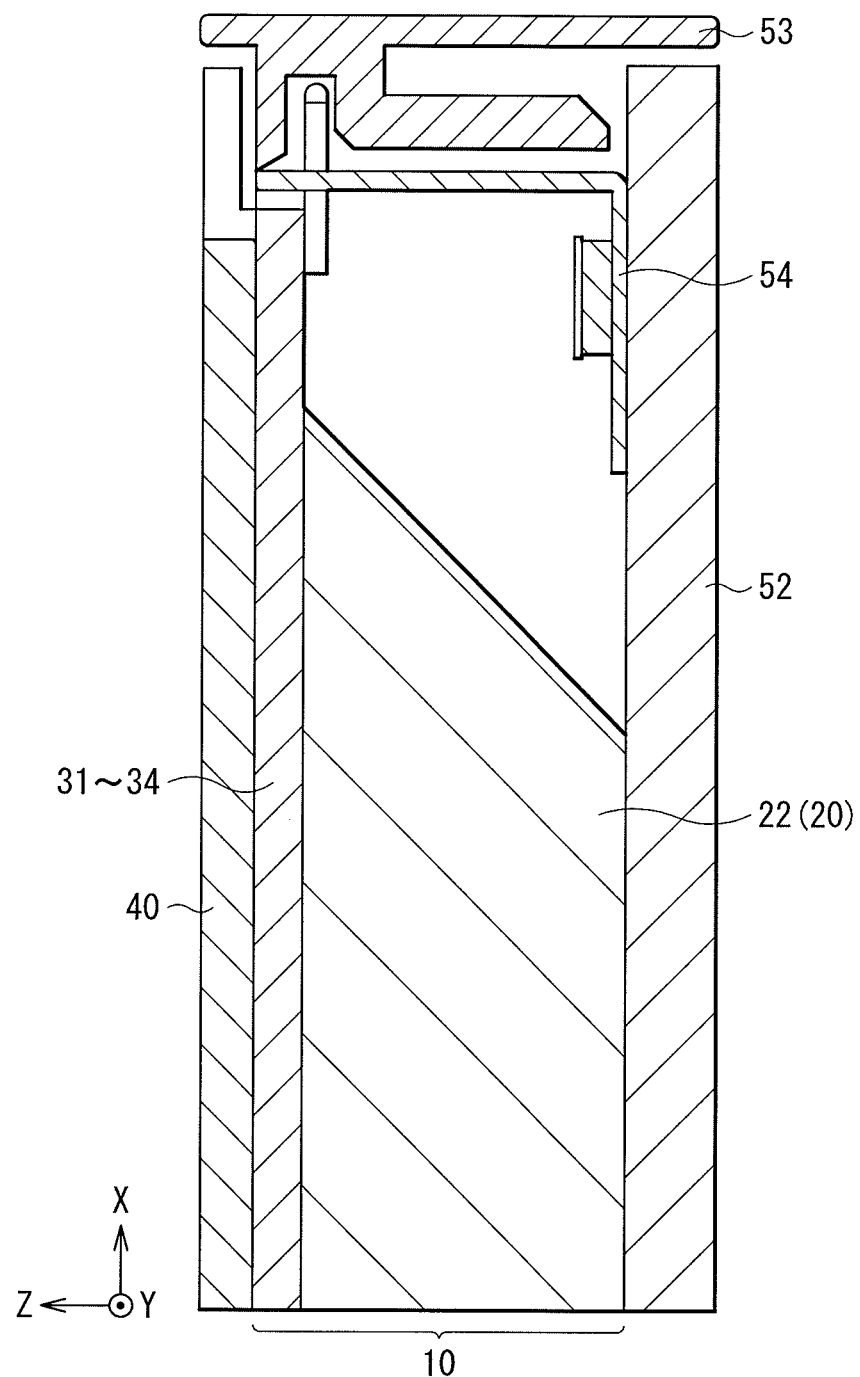

[ FIG. 3 ]
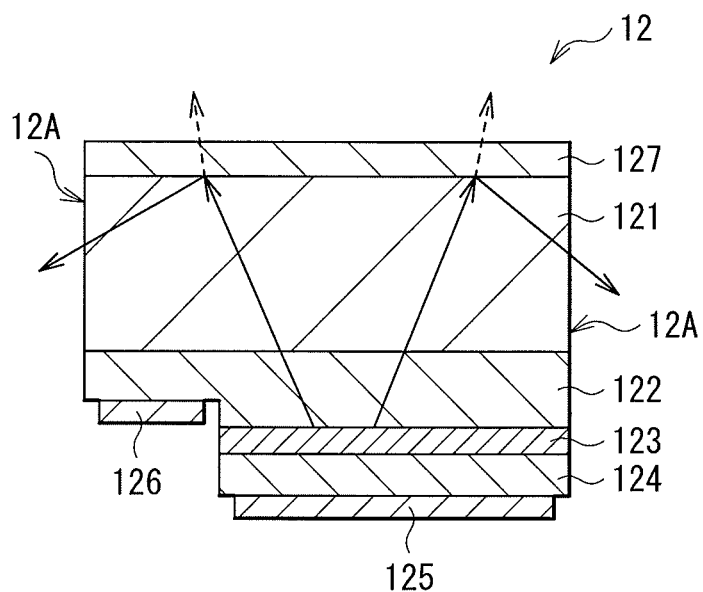
[ FIG. 4 ]
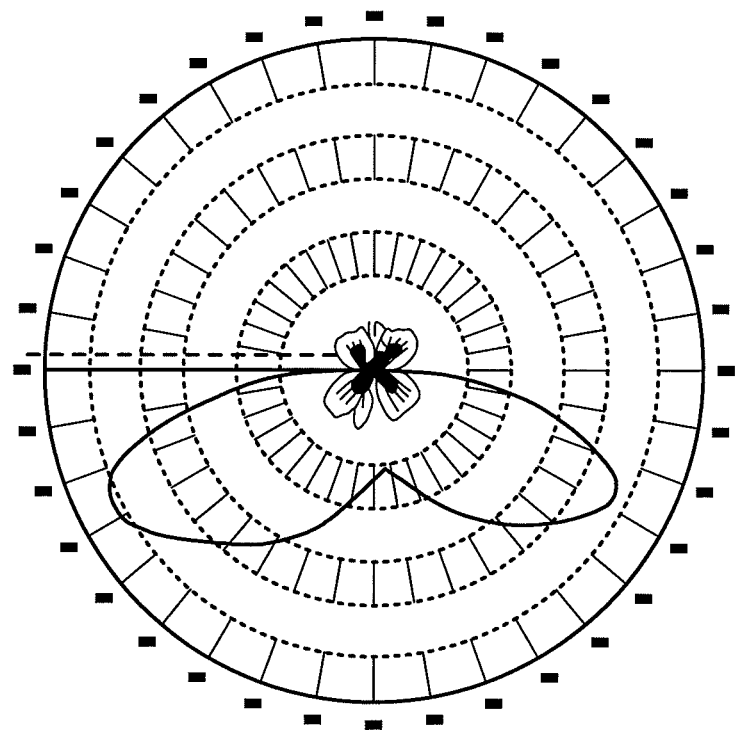

[ FIG. 5 ]
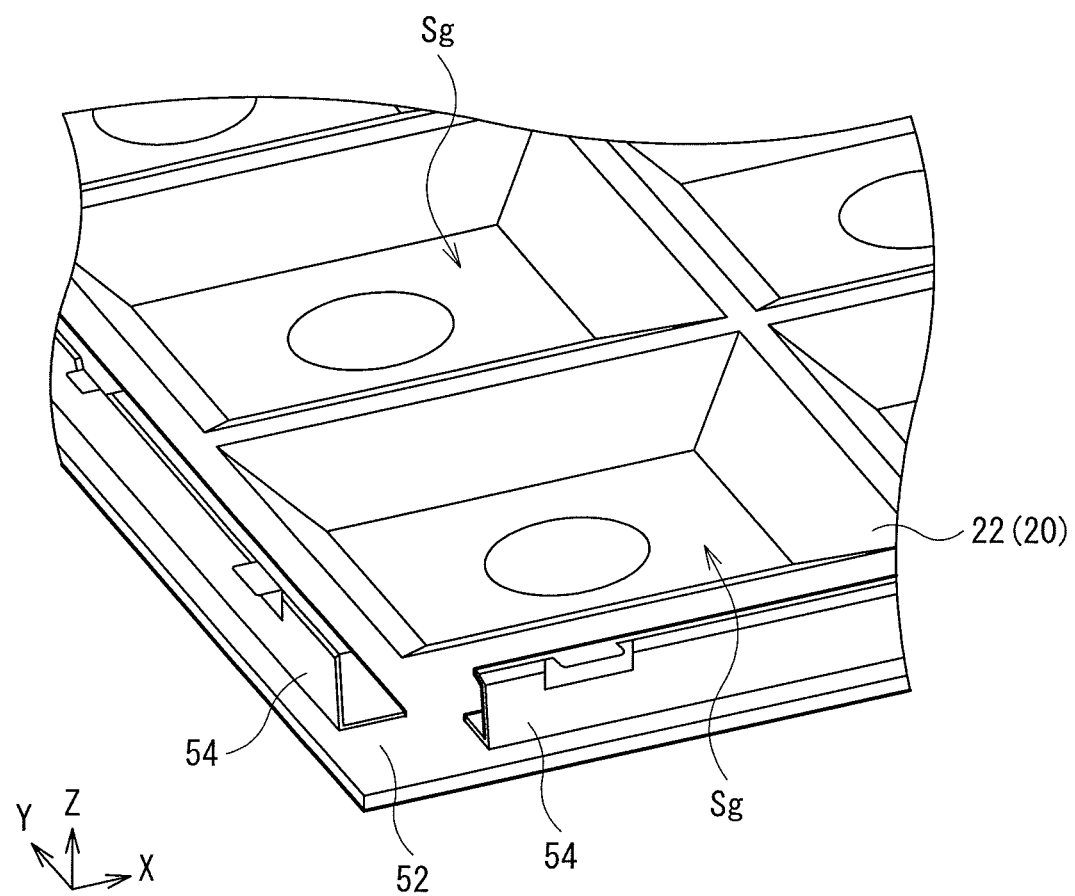

[FIG. 6]
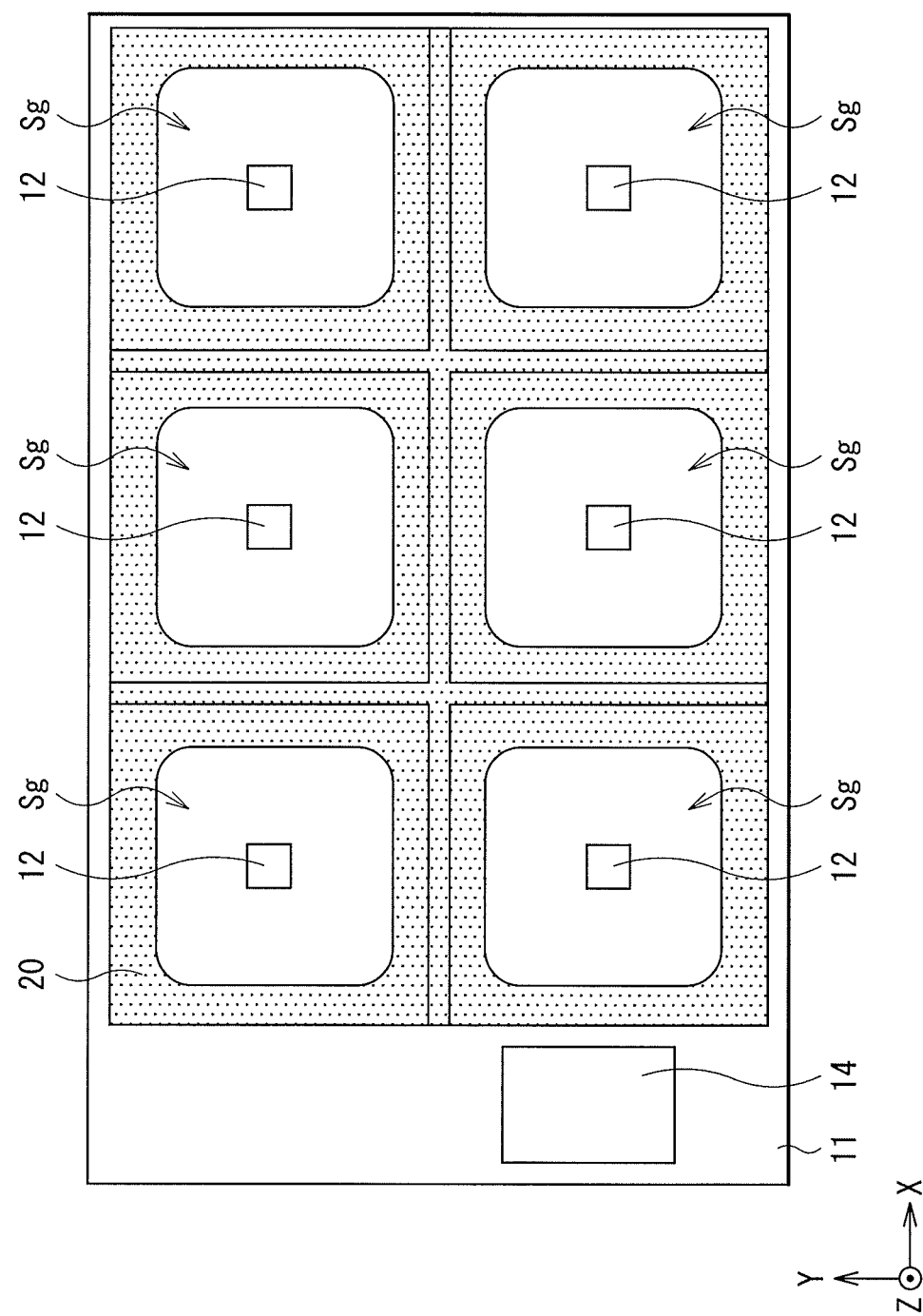

[ FIG. 7 ]
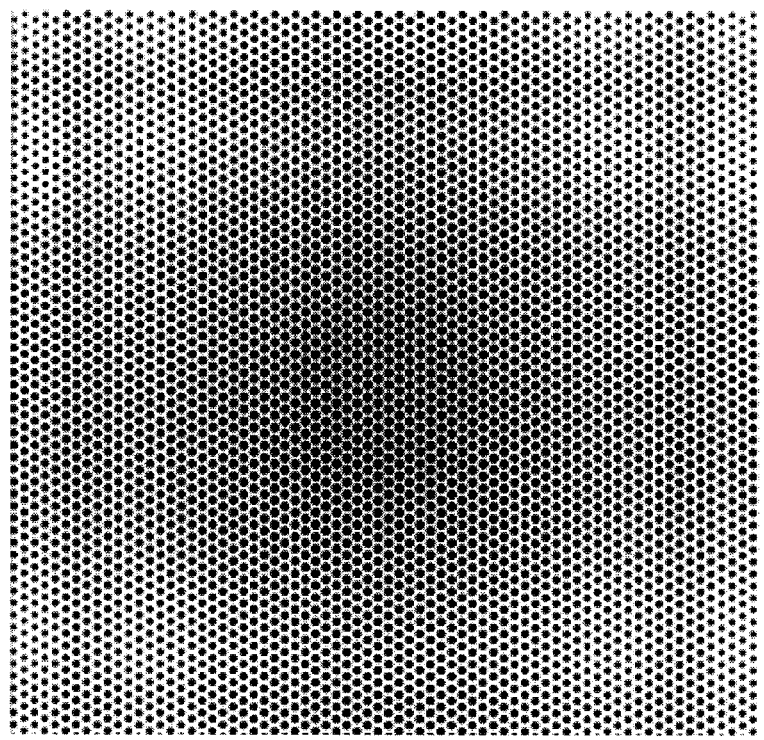

[FIG. 8]
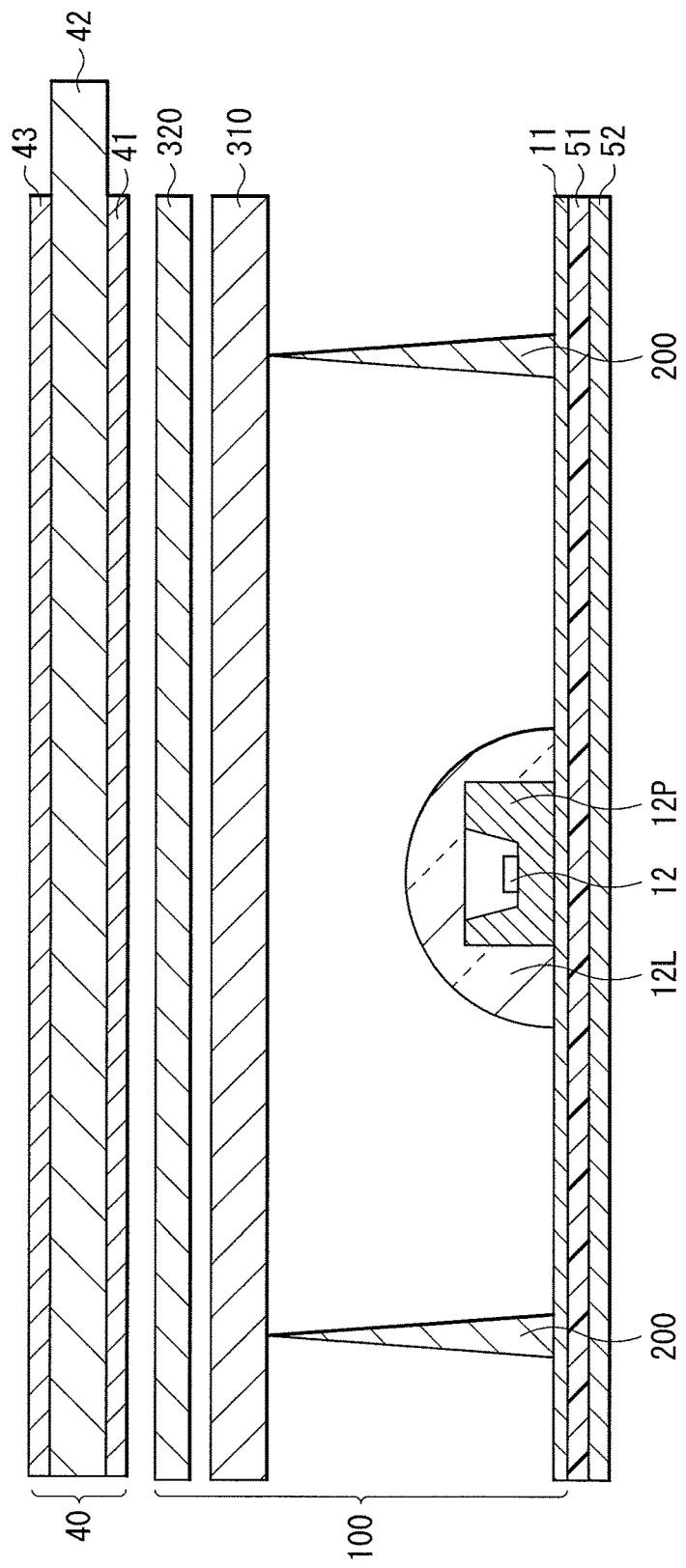

[FIG. 9]
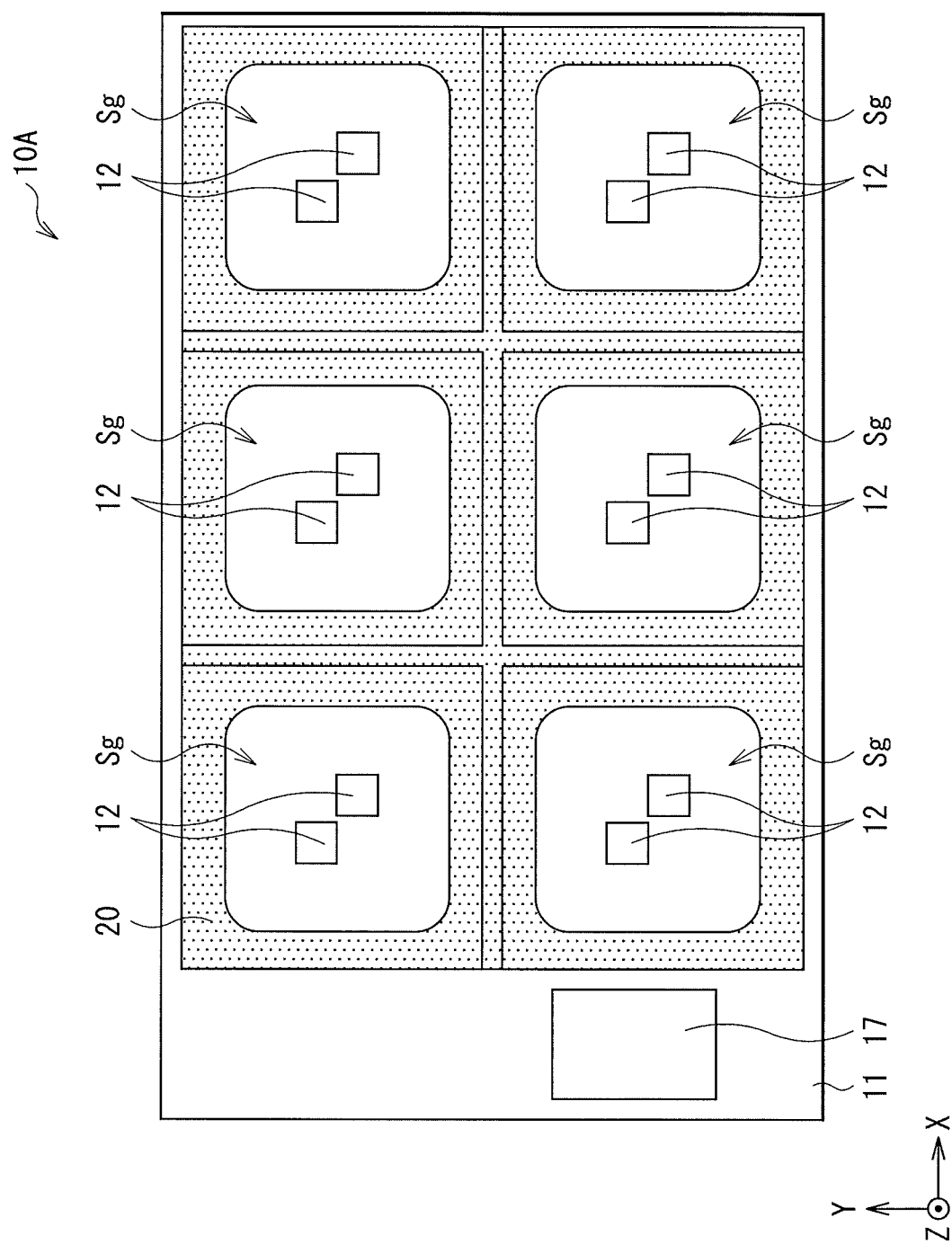

[ FIG. 10 ]
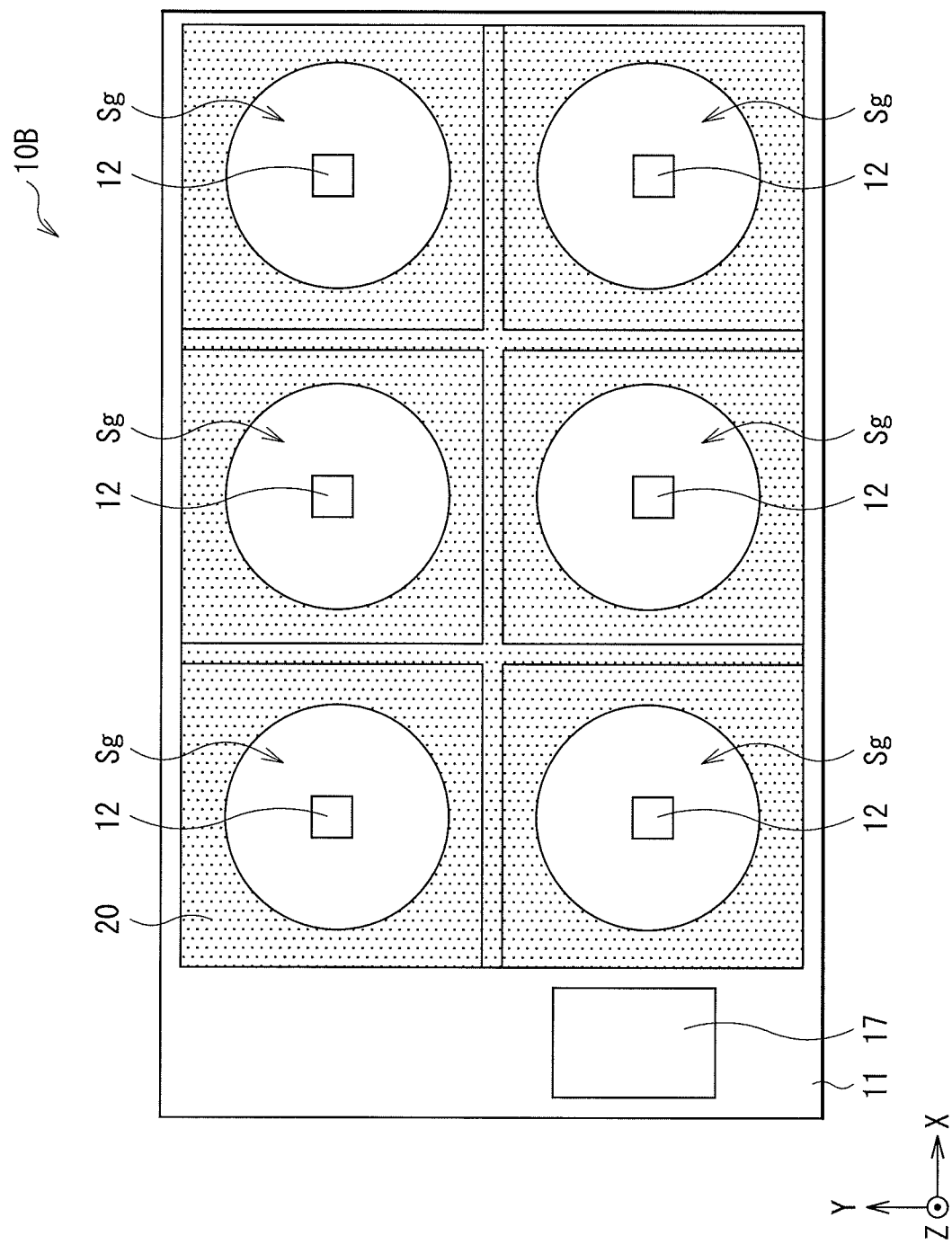

[FIG. 11]
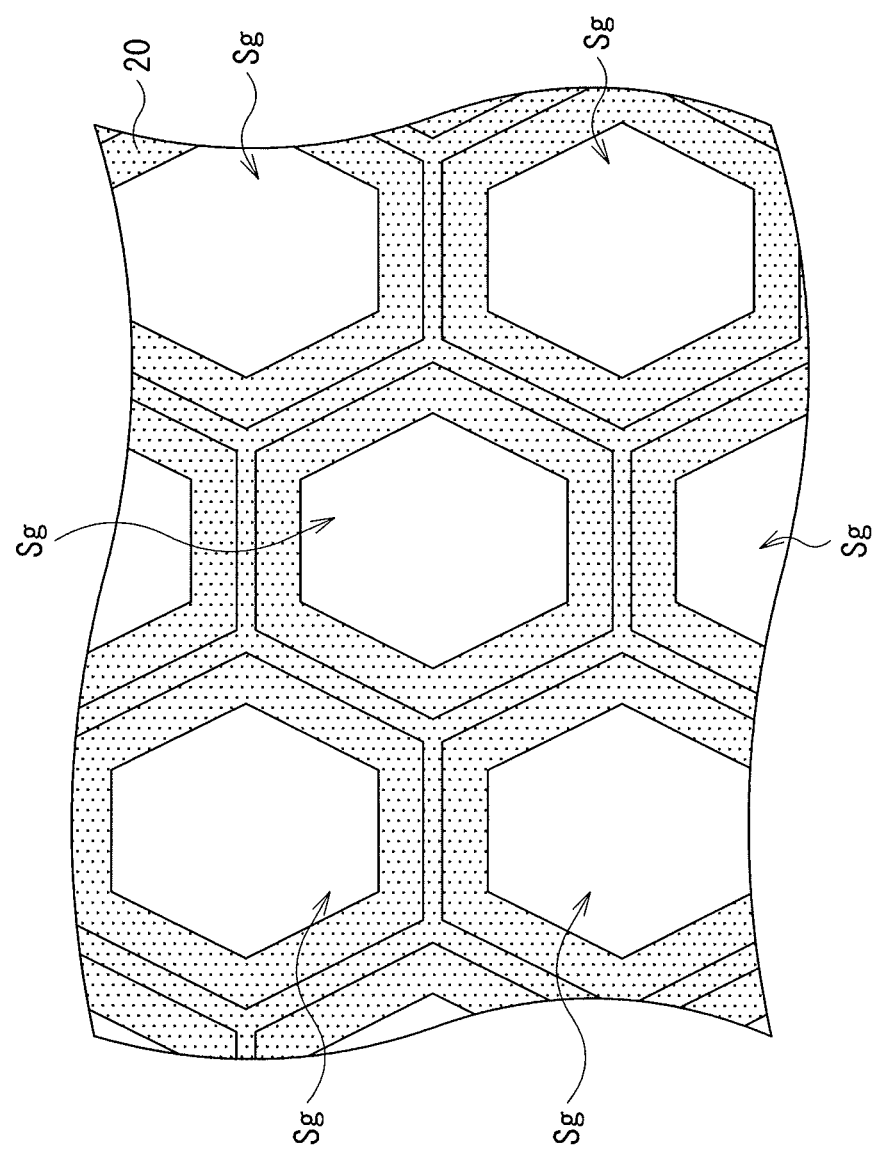

[ FIG. 12 ]
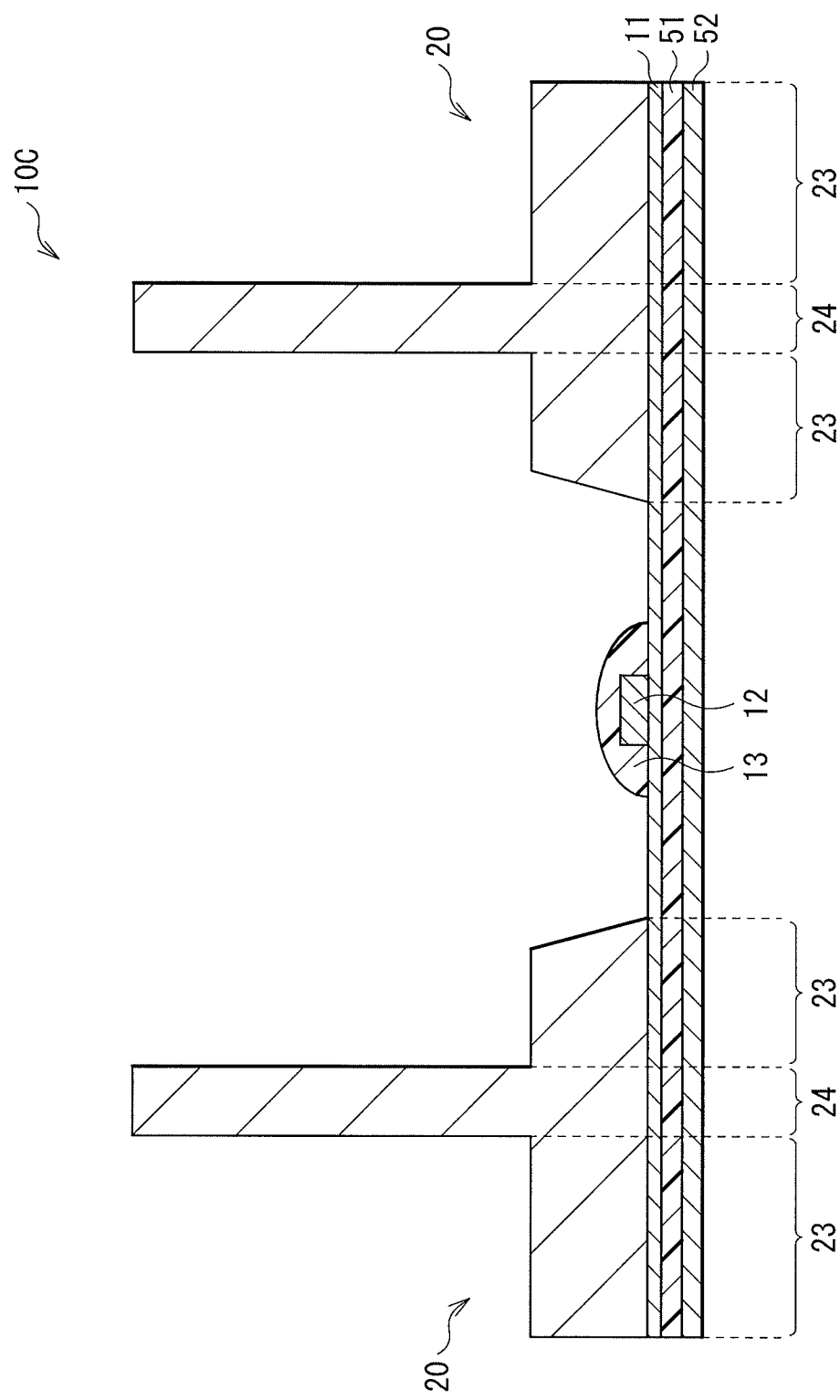

[ FIG. 13A ]
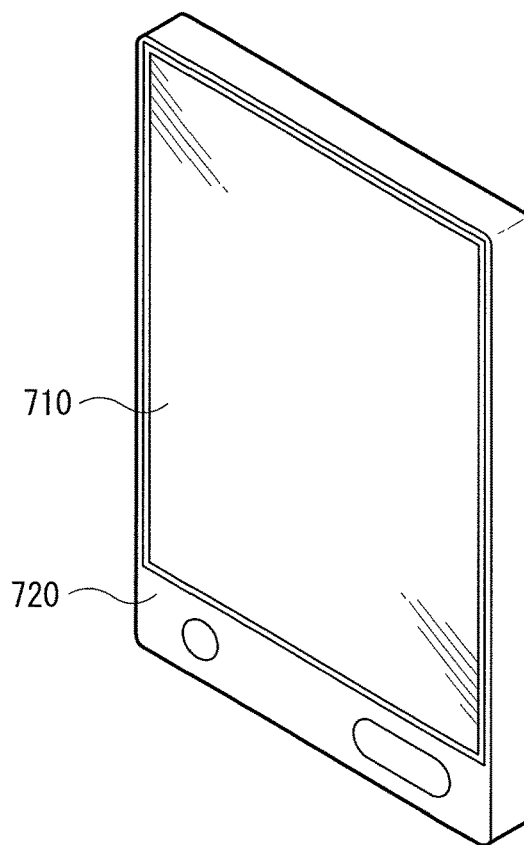
[ FIG. 13B ]
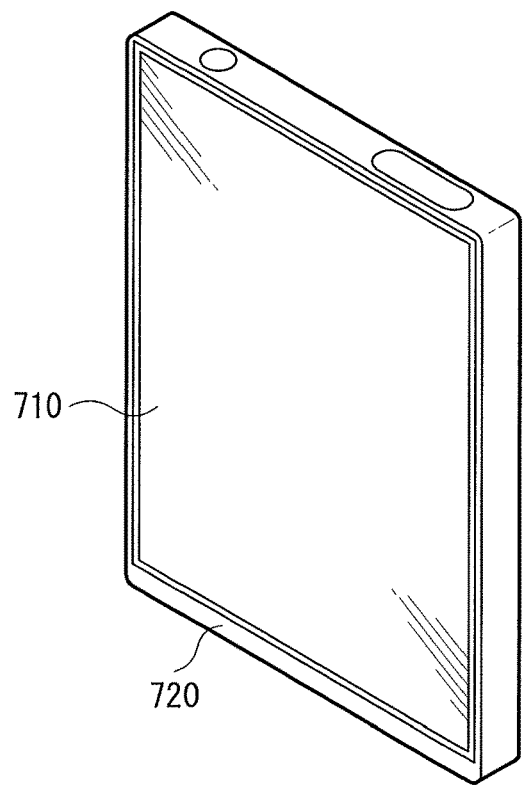

[ FIG. 14 ]
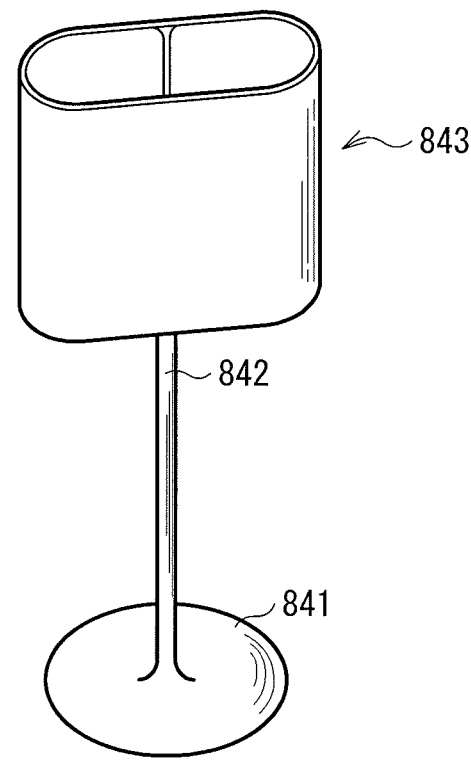
[ FIG. 15 ]
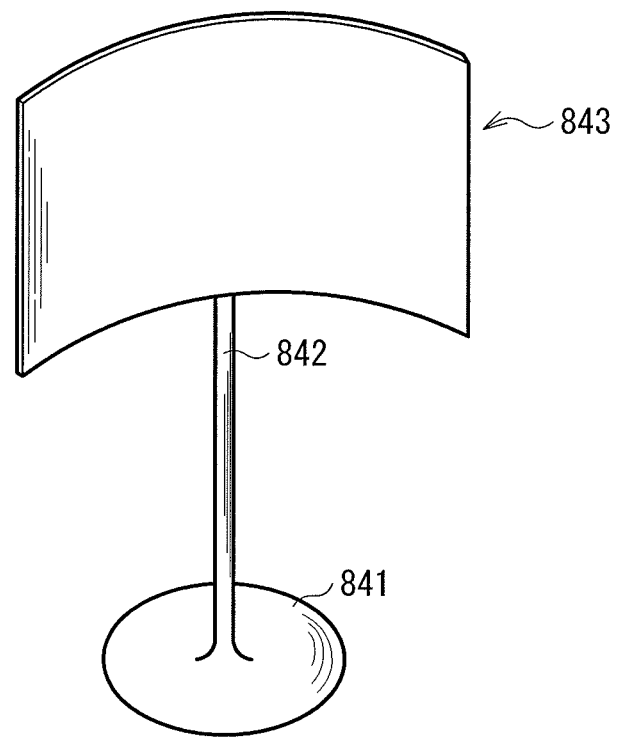

[ FIG. 16 ]
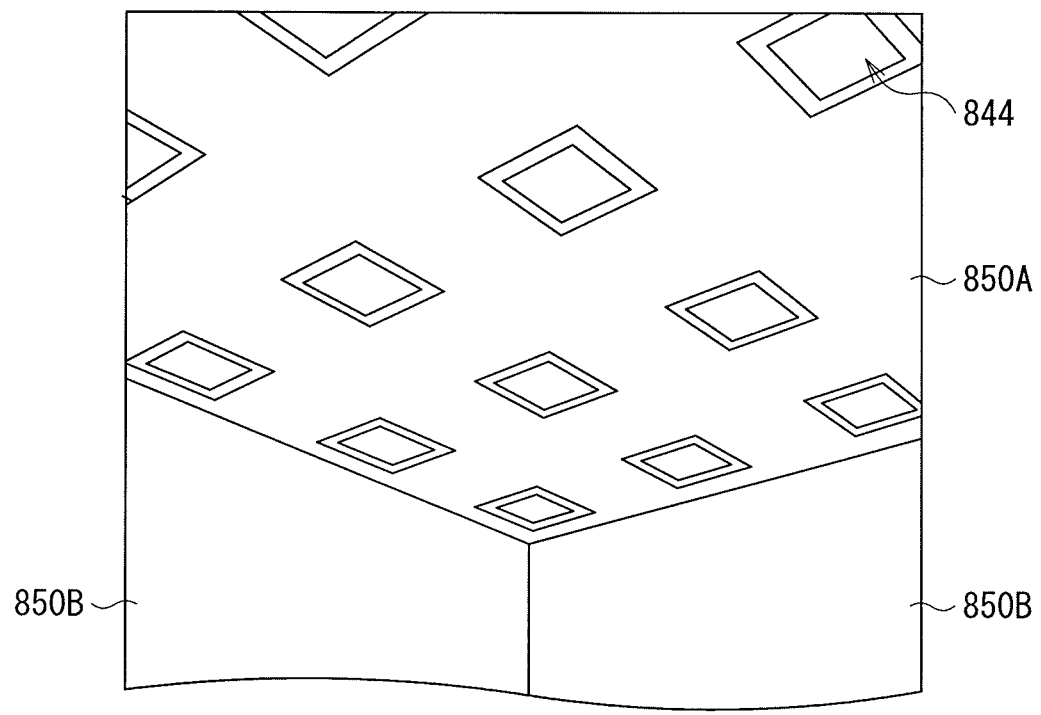

LIGHT EMITTING DEVICE, DISPLAY DEVICE, AND LIGHTING DEVICE

CROSS-REFERENCE TO RELATED APPLICATIONS

This application is a national phase entry under 35 U.S.C. § 371 of International Application No. PCT/JP2017/026861 filed Jul. 25, 2017, which claims the priority from Japanese Patent Application No. 2016-198773 filed in the Japanese Patent Office on Oct. 7, 2016, the entire contents of which are hereby incorporated by reference.

TECHNICAL FIELD

The technology relates to a light emitting device including, for example, a light emitting element such as an LED (Light Emitting Diode), and a display device and a lighting device including the light emitting device.

BACKGROUND ART

Surface light emitting devices using LEDs (Light Emitting Diodes) are adopted in backlights of liquid crystal display devices or lighting devices (for example, refer to PTL 1).

CITATION LIST

Patent Literature

PTL 1: Japanese Unexamined Patent Application Publication No. 2005-38776

SUMMARY OF THE INVENTION

For light emitting devices used as surface light sources, enhancement in luminance uniformity is desired.

It is therefore desirable to provide a light emitting device having high luminance uniformity, and a display device and a lighting device including the light emitting device.

A light emitting device according to an embodiment of the technology includes: a light emitting element; a reflection wall that surrounds the light emitting element; and a diffusion reflection sheet that includes a plurality of particles and permits entrance of emitted light from the light emitting element and reflected light from the reflection wall.

A display device according to an embodiment of the technology includes, as a light emitting device that sends out illumination light toward a display panel, the light emitting device according to the embodiment of the technology as mentioned above.

A lighting device according to an embodiment of the technology includes the light emitting device according to the embodiment of the technology as mentioned above.

In the light emitting device, the display device, and the lighting device according to the embodiments of the technology, light emitted from the light emitting element directly enters the diffusion reflection sheet, or is reflected from the reflection wall and enters the diffusion reflection sheet. In the diffusion reflection sheet, the entering light is efficiently diffused by and reflected from the plurality of the particles. Light traveling from the diffusion reflection sheet toward the reflection wall is reflected from the reflection wall and enters the diffusion reflection sheet again.

According to the light emitting device, the display device, and the lighting device of the embodiments of the technology, the diffusion reflection sheet includes the plurality of the particles. This leads to efficient luminance uniformization within a region surrounded by the reflection wall. Hence, it is possible to enhance luminance uniformity. It is to be noted that the effects described here are not necessarily limited, and any effect described in the disclosure may be provided.

BRIEF DESCRIPTION OF DRAWING

FIG. 1 is a cross-sectional view of a configuration at a mid-portion of a display device according to one embodiment of the technology.

FIG. 2 is a cross-sectional view of a configuration at an end portion of the display device illustrated in FIG. 1.

FIG. 3 is a cross-sectional view of a configuration of a light emitting element illustrated in FIG. 1.

FIG. 4 is a diagram that illustrates light distribution of the light emitting element illustrated in FIG. 1.

FIG. 5 is a perspective view provided for description of a configuration of a reflection wall illustrated in FIG. 1.

FIG. 6 is a plan view provided for the description of the configuration of the reflection wall illustrated in FIG. 1.

FIG. 7 is a diagram that illustrates a distribution pattern of a plurality of particles included in a diffusion reflection sheet illustrated in FIG. 1.

FIG. 8 is a cross-sectional view of a configuration of a display device according to a comparative example.

FIG. 9 is a plan view of a configuration of a main part of a light emitting device according to a modification example 1.

FIG. 10 is a plan view of a configuration of a main part of a light emitting device according to a modification example 2.

FIG. 11 is a plan view of another example of a reflection wall illustrated in FIG. 10.

FIG. 12 is a cross-sectional view of a configuration of a main part of a light emitting device according to a modification example 3.

FIG. 13A is a perspective view of an external appearance of an electronic apparatus to which the display devices illustrated in FIG. 1 and other figures are applied.

FIG. 13B is a perspective view of another example of the electronic apparatus illustrated in FIG. 13A.

FIG. 14 is a perspective view of one example of an external appearance of a lighting device to which the light emitting devices illustrated in FIG. 1 and other figures are applied.

FIG. 15 is a perspective view of another example (1) of the lighting device illustrated in FIG. 14.

FIG. 16 is a perspective view of another example (2) of the lighting device illustrated in FIG. 14.

MODES FOR CARRYING OUT THE INVENTION

In the following, some embodiments of the technology are described in detail with reference to the drawings. It is to be noted that description is made in the following order.
1. Embodiment (display device: an example with a diffusion reflection sheet including a plurality of particles)
2. Modification Example 1 (an example with a plurality of light emitting elements in a single segment)
3. Modification Example 2 (an example with a reflection wall having a planar shape of a circle or a honey-comb structure)

4. Modification Example 3 (an example in which a height of a reflection wall varies within a single segment)
5. Application Examples (electronic apparatuses and lighting devices)

Embodiment

Configuration of Display Device 1

FIG. 1 illustrates a cross-sectional configuration of a mid-portion of a display device (display device 1) according to one embodiment of the technology. FIG. 2 illustrates a cross-sectional configuration of an end portion of the display device 1. The display device 1 includes a light emitting device 10 and a display panel 40. A back side of the display panel is illuminated with illumination light of the light emitting device 10. A rear casing 52 is provided on back side of the light emitting device 10, with an adhesion sheet 51 in between. A bezel 53 and a holder member 54 are provided on a periphery of the display device 1.

The light emitting device 10 includes, for example, a light source substrate 11, a light emitting element 12, a covering material 13, a reflection wall 20, a diffusion reflection sheet 31, a first optical sheet 32, a wavelength conversion sheet 33, and a second optical sheet 34. In the light emitting device 10, the diffusion reflection sheet 31, the first optical sheet 32, the wavelength conversion sheet 33, and the second optical sheet 34 are provided to face the light source substrate 11. The reflection wall 20 is provided between the light source substrate 11 and the diffusion reflection sheet 31, to surround the light emitting element 12.

An undepicted wiring pattern is provided on the light source substrate 11, to permit a light emission control for each region surrounded by the reflection wall 20 (segment Sg in FIG. 5 described later). This makes it possible to make a local light emission control (local dimming) of a plurality of the light emitting elements 12. For the light source substrate 11, used may be, for example, a resin-made film on which a wiring pattern is printed. Examples of the resin-made film include PET (polyethylene terephthalate), PEN (polyethylene naphthalate), and fluorine-based resin material. At an end portion of the light source substrate 11, provided is, for example, a driver IC (driver IC 14 in FIG. 6 described later) that drives the light emitting element 12. The driver IC may be provided on a wiring substrate separate from the light source substrate 11.

The plurality of the light emitting elements 12 are provided on a front surface of the light source substrate 11. The light emitting elements 12 are each an LED having, for example, a flip chip structure of a face down type, and emit light of a blue wavelength range.

FIG. 3 illustrates a cross-sectional configuration of the light emitting element 12. The light emitting element 12 includes, for example, a translucent substrate 121 that faces the light source substrate 11. A semiconductor stacked body is provided on one surface (confronted surface with the light source substrate 11) of the translucent substrate 121. The semiconductor stacked body includes, for example, an n type semiconductor layer 122, an active layer 123, and a p type semiconductor layer 124 in this order from side on which the translucent substrate 121 is disposed. A p side electrode 125 is provided on a surface of the p type semiconductor layer 124. A shoulder is provided in a portion of the semiconductor stacked body. A portion of the n type semiconductor layer 122 is exposed in the shoulder. An n side electrode 126 is provided on an exposed surface of the n type semiconductor layer 122. A reflection layer 127 is provided on another surface (opposite surface to the confronted surface with the light source substrate 11) of the translucent substrate 121. The translucent substrate 121 includes, for example, a sapphire substrate or silicon carbide (SiC). The n type semiconductor layer 122 includes, for example, an n type nitride semiconductor (e.g., n type GaN). The active layer 123 includes, for example, a nitride semiconductor (e.g., n type GaN) having a quantum well structure. The p type semiconductor layer 124 includes, for example, a p type nitride semiconductor (e.g., p type GaN). The p side electrode 125 and the n type electrode 126 include, for example, a metal material such as Al. The reflection layer 127 includes, for example, a silver deposition film, an aluminum deposition film, or a multi-layer reflection film. In the light emitting element 12, light generated in the active layer 123 is reflected from the reflection layer 127, the p side electrode 125, and the n side electrode 126, and is emitted to outside through a side surface 12A. A portion of the light generated in the active layer 123 may leak out to the outside through the reflection layer 127.

FIG. 4 illustrates a light distribution characteristic of the light emitting element 12. The light emitting element 12 is a light emitting element of a so-called side emission type, in which relatively intense light is emitted in a substantially parallel direction to a surface of the light source substrate 11. The light emitting element 12 is, for example, an LED of a bare chip type, and is devoid of a package (package 12P in FIG. 8 described later) and a lens (lens 12L in FIG. 8). Such a light emitting element 12 is inexpensive, and makes it possible to reduce costs incurred for the display device 1. Moreover, if the light emitting element 12 is inexpensive, it is possible to use a large number of the light emitting elements 12, and to reduce electric power to be supplied to each of the light emitting elements 12. Hence, it is possible to suppress heat generation of the light emitting elements 12, leading to prevention of an increase in a temperature of the light emitting device 10. The light emitting element 12 encased inside a package may be also used.

The covering material 13 that covers the light emitting element 12 includes, for example, a resin material such as a silicone resin. The covering material 13 has a substantially hemispherical shape. The light emitting element 12 is provided inside the covering material 13. The covering material 13 has a refractive index between a refractive index of the light emitting element 12 (translucent substrate 121) and a refractive index of air, and has a function of enhancing efficiency of extraction of light emitted from the light emitting element 12. Moreover, by the covering material 13, it is possible to control a direction of light distribution of the light emitting element 12.

The reflection wall 20 is provided for reflection of the light emitted from the light emitting element 12 of the side emission type, toward side on which the diffusion reflection sheet 31 is disposed. Although details are described later, providing the reflection wall 20 as mentioned above makes it possible to enhance luminance of light that enters the display panel 40 from the light emitting device 10 (enhancement in an direct upward contribution ratio). The reflection wall 20 includes a horizontal part 21 in a parallel direction, and an inclined part 22 in a crossing direction, with respect to, for example, the light source substrate 11. The horizontal part 21 and the inclined part 22 are each provided around, for example, the single light emitting element 12. The reflection wall 20 surrounds the light emitting element 12 in plan (XY plane) view. The horizontal part 21 is in contact with the light source substrate 11. An angle of inclination of the inclined part 22 may be adjusted as appropriate. An upper end of the inclined part 22 is in contact with the diffusion reflection sheet 31.

FIG. 5 is a perspective view of a configuration of the reflection wall 20 together with the rear casing 52 and the holder member 54. FIG. 6 is a plan view of a configuration of the reflection wall 20 together with the light source substrate 11 and the light emitting element 12. The light emitting device 10 includes a plurality of the segments Sg partitioned by the reflection wall 20. The reflection wall 20 surrounds the light emission element 12 in, for example, a rectangular shape in plan view (a planar shape of the segment Sg is the rectangular shape). In the single segment Sg, for example, the single light emitting element 12 is provided. Light emission states of the light emitting elements 12 are controlled from the segment Sg to the segment Sg by the driver IC 14, making it possible to adjust the light emission state of each of the light emitting elements 12 in accordance with pictures to be displayed on the display panel 40. Hence, it is possible to reduce power consumption.

The reflection wall 20 is formed by, for example, vacuum forming or vacuum pressure forming of a resin-made shaped reflection sheet. The shaped reflection sheet is a resin sheet to a surface of which an optical element of a predetermined shape is applied. The optical element of the predetermined shape is, for example, a minute protrusion pattern. A cross-sectional shape of the protrusion pattern is, for example, a circular arc shape, an elliptical arc shape, a triangular shape, or a rectangular shape.

The diffusion reflection sheet 31 faces the light source substrate 11, with the reflection wall 20 in between. The diffusion reflection sheet 31 permits entrance of, for example, the light emitted from the light emitting element 12 and the reflected light from the reflection wall 20. In this embodiment, the diffusion reflection sheet 31 includes a plurality of particles. This causes efficient diffusion and reflection of entering light, leading to uniformization of luminance from the segment Sg to the segment Sg, although details are described later.

It is preferable that at least some of the plurality of the particles included in the diffusion reflection sheet 31 have a hollow structure, in view of diffusion efficiency. The plurality of the particles included in the diffusion reflection sheet 31 are, for example, hollow silica, titanium dioxide, and have a particle diameter of the order of, for example, nanometers.

The diffusion reflection sheet 31 is formed by printing on, for example, a resin sheet with an ink including the plurality of the particles in a predetermined distribution pattern from the segment Sg to the segment Sg. The ink including the plurality of the particles is printed on the resin sheet by, for example, an ink jet method.

FIG. 7 illustrates one example of the distribution pattern of the plurality of the particles to be printed on the diffusion reflection sheet 31. The distribution pattern illustrates a distribution pattern to be printed in the single segment Sg. For example, the plurality of the particles are densified in a region directly over the light emitting element 12, and are less densified in its surroundings. Luminance of the light emitted from the light emitting element 12 is highest directly over the light emitting element 12. Accordingly, providing more particles in the region (directly over the light emitting element 12) that is most intensely illuminated with the light makes it possible to cause more effective diffusion and reflection of the light.

The first optical sheet 32 is provided between the diffusion reflection sheet 31 and the wavelength conversion sheet 33 in parallel to them. The first optical sheet 32 is, for example, a POP (Prism On Prism) or PPD (Prism On Prism Diffuser). Providing the first optical sheet as mentioned above makes it possible to enhance directivity of light, leading to enhancement in front luminance. The first optical sheet 32 may be provided unitarily with the diffusion reflection sheet 31.

The wavelength conversion sheet 33 is provided between the first optical sheet 32 and the second optical sheet 34 in parallel to them. The wavelength conversion sheet 33 includes, for example, a wavelength conversion substance such as a fluorescent substance or quantum dots. The wavelength conversion substance is excited by the light emitted from the light emitting element 12, and outputs light of a different wavelength range from that of the light emitted from the light emitting element 12. For example, the wavelength conversion sheet 33 is excited by the light of the blue wavelength range emitted from the light emitting element 12, and outputs light of a red wavelength range and a green wavelength range. The wavelength conversion sheet 33 may be excited by the light of the blue wavelength range emitted from the light emitting element 12, and output light of a yellow wavelength range. The light emitted from the light emitting element 12 as mentioned and the light subjected to the wavelength conversion are mixed, causing, for example, white light to enter the second optical sheet 34.

The second optical sheet 34 is provided between the wavelength conversion sheet 33 and the display panel 40 in parallel to them. The second optical sheet 34 is, for example, a reflection type polarization film (DBEF: Dual Brightness Enhancement Film). For example, the second optical sheet 34 as mentioned separates light that has passed through the wavelength conversion sheet 33, into a p wave and an s wave, and transmits the p wave while reflecting the s wave. The s wave reflected from the second optical sheet 34 is reflected from, for example, the light source substrate 11, the reflection wall 20, and the diffusion reflection sheet 31, and the reflected wave is recirculated.

The display panel 40 is, for example, a transmissive liquid crystal display panel that displays a moving image or a still image. The display panel 40 is provided to face the second optical sheet 34, and includes, for example, a TFT substrate 41, a liquid crystal layer 42, and a color filter substrate 43 in this order from a position close to the second optical sheet 34. The display panel 40 may further include, for example, a polarization plate. For example, the light emitted from the light emitting device 10 enters the TFT substrate 41, travels through the liquid crystal layer 42, and is outputted on side on which the color filter substrate 43 is disposed.

The rear casing 52 is bonded to a rear surface of the light source substrate 11 (opposite surface to the surface on which the light emitting element 12 is provided), with the adhesion sheet 51 in between. The rear casing 52 includes a plate member, and maintains flatness of the light source substrate 11. The rear casing 52 includes, for example, a metal such as Fe (iron) and Al (aluminum), glass, or a stacked body. The adhesion sheet 51 includes, for example, a double sided tape.

The bezel 53 is a frame member that covers a peripheral part of the display panel 40 and a peripheral part of the light emitting device 10. The bezel 53 protects each of the peripheral part of the display panel 40 and the peripheral part of the light emitting device 10, while enhancing aesthetic quality. The bezel 53 includes, for example, a metal such as Al (aluminum).

The holder member 54 is provided between the bezel 53 and an end surface of the reflection wall 20. The holder member 54 is, for example, an attachment metal plate, and holds, for example, the bezel 53 and the sheets (the diffusion reflection sheet 31 to the second optical sheet 34). The holder member 54 is provided on a periphery of the rear casing 52, and is fixed to the rear casing 52 with, for example, screws. A portion of the holder member 54 faces the end surface of the reflection wall 20. The holder member 54 includes, for example, a metal material such as Al (aluminum) and stainless steel.

Operation of Display Device 1

In the display device 1, upon the emission of, for example, the light of the blue wavelength range from the light emitting element 12 of the side emission type, the light is reflected from the reflection wall 20. The reflected light enters the diffusion reflection sheet 31. A portion of the light emitted from the light emitting element 12 directly enters the diffusion reflection sheet 31. The diffusion reflection sheet 31 transmits a portion of the entering light. The transmitted light travels through the first optical sheet 32, and enters the wavelength conversion sheet 33. In the wavelength conversion sheet 33, a portion of the entering light (light of the blue wavelength range) is wavelength-converted to, for example, the light of the red wavelength range and the light of the green wavelength range. The wavelength-converted light and light that has not been wavelength-converted by the wavelength conversion sheet 33 is synthesized to produce, for example, the white light. The white light travels through the second optical sheet 34 to enter the display panel 40, causing picture display. Meanwhile, the light reflected from the diffusion reflection sheet 31 is reflected from the reflection wall 20, to produce recirculated light that generates the white light as mentioned above.

Here, the diffusion reflection sheet 31 includes the plurality of the particles. Accordingly, the light entering the diffusion reflection sheet 31 is efficiently diffused by and reflected from the plurality of the particles. This causes luminance uniformization within the region surrounded by the reflection wall 20 (segment Sg). In the following, description about this is given with the use of a comparative example.

FIG. 8 illustrates a cross-sectional configuration of a display device according to a comparative example. In this display device, light emitted from a light emitting device (light emitting device 100) enters the display panel 40. In the light emitting device 100, light emitted from the light emitting element 12 enters a diffusion plate 310. The diffusion plate 310 transmits a portion of the entering light. The transmitted light enters the display panel 40 through an optical sheet 320. Support pins 200 are provided between the light source substrate 11 and the diffusion plate 310, for support of, for example, the diffusion plate 310. The light emitting element 12 is provided inside a package 12P, and the package 12P is covered with a lens 12L.

In the light emitting device 100 as mentioned above, no reflection wall (reflection wall 20 in FIG. 1) is provided. Accordingly, the light emitted from the light emitting element 12 directly enters the diffusion plate 310. Within the light emitted from the light emitting element 12, light that has failed to enter the diffusion plate 310 is not to be recirculated, causing difficulties in enhancing luminance of the light that enters the display panel 40 from the light emitting device 100. Moreover, it is difficult for the diffusion plate 310 to sufficiently diffuse the entering light. Thus, luminance becomes higher in a region directly over the light emitting element 12, resulting in likelihood of luminance unevenness. To suppress the occurrence of the luminance unevenness involves increasing a distance from the light emitting element 12 to the diffusion plate 310. Magnitude of the distance from the light emitting element 12 to the diffusion plate 310 has an influence on a thickness of the display device.

In contrast, in this embodiment, the reflection wall 20 is provided around the light emitting element 12 of the side emission type. This causes a portion of the light emitted from the light emitting element 12 to be reflected from the reflection wall 20, and the reflected light enters the diffusion reflection sheet 31. It is therefore possible to use the reflected light from the reflection wall 20, in addition to the light that is emitted from the light emitting element 12 and directly enters the diffusion reflection sheet 31. In other words, it is possible to enhance luminance of the light emitting device 10. Moreover, in this embodiment, used is the diffusion reflection sheet 31 that includes the plurality of the particles. Thus, in the diffusion reflection sheet 31, light diffusion and reflection is performed at high efficiency. This leads to efficient luminance uniformization within the segment Sg. Even in a case with reduction in a distance from the light emitting element 12 to the diffusion reflection sheet 31, the luminance is sufficiently uniformized within the segment Sg.

Furthermore, the plurality of the particles included in the diffusion reflection sheet 31 have the hollow structure. This makes it possible to perform the diffusion and the reflection at higher efficiency. In addition, the plurality of the particles are densified in the region directly over the light emitting element 12. Hence, it is possible to uniformize the luminance, while reducing the distance from the diffusion reflection sheet 31 and the light emitting element 12.

Moreover, providing the diffusion reflection sheet 31, instead of the diffusion plate 310, leads to weight reduction. This makes unnecessary, for example, the support pins 200 and a middle chassis, while making it possible for the reflection wall 20 to support, for example, the diffusion reflection sheet 31.

Moreover, the light emitting device 10 uses the light emitting element 12, without providing the package (package 12P in FIG. 8) and the lens (lens 12L in FIG. 8). Hence, it is possible to manufacture at low costs. Furthermore, providing a number of the inexpensive light emitting elements 12 also makes it possible to prevent the increase in the temperature of the light emitting device 10. In addition, absence of lenses makes it possible to reduce the distance from the light emitting element 12 to the diffusion reflection sheet 31. Moreover, using the light emitting element 12 of the flip chip structure also makes it possible to reduce the distance from the light emitting element 12 to the diffusion reflection sheet 31, as compared to a case with the use of a wire-bonded light emitting element.

As described, in this embodiment, the reflection wall 20 is provided around the light emitting element 12 of the side emission type. Hence, it is possible to enhance the luminance of the light emitting device 10. Moreover, the diffusion reflection sheet 31 includes the plurality of the particles. Hence, it is possible to enhance the luminance uniformity within the segment Sg, without increasing the distance from the light emitting element 12 to the diffusion reflection sheet 31. In other words, it is possible to provide compatibility between low profile and in-plane luminance uniformity of the light emitting device 10.

Furthermore, the resin sheet such as the shaped reflection sheet that constitutes the reflection wall 20 efficiently reflects light of a low wavelength range, as compared to light of a high wavelength range. It is therefore preferable to use the light emitting element 12 that emits light of the blue wavelength range.

In addition, it is preferable to provide the wavelength conversion sheet 33 between the diffusion reflection sheet 31 and the display panel 40. The wavelength conversion substance included in the wavelength conversion sheet 33 as mentioned above is disposed further away from the light emitting element 12 than a wavelength conversion substance mixed in, for example, the package (package 12P in FIG. 8). This reduces influences of, for example, heat generated in the light emitting element 12, leading to enhancement in wavelength conversion efficiency. Moreover, synthesizing the white light at a closer position to the display panel 40 reduces likelihood of color unevenness. Furthermore, an allowance range of performance of the light emitting element 12 is widened, making it possible to reduce costs.

Described below are modification examples of the forgoing embodiment. In the following description, the same constituent parts to those of the forgoing embodiment are denoted by the same reference characters, and description thereof is omitted as appropriate.

Modification Example 1

FIG. 9 illustrates a plan configuration of a main part of a light emitting device (light emitting device 10A) according to a modification example 1 of the forgoing embodiment. The light emitting device 10A includes a plurality of the light emitting elements 12 within the single segment Sg. In FIG. 9, illustrated is a case where the two light emitting elements 12 are provided within the single segment Sg. However, the three or more light emitting elements 12 may be provided within the single segment Sg. Otherwise, the light emitting device 10A has similar configurations to those of the light emitting device 10 of the forgoing embodiment, and has similar workings and effects as well.

Modification Example 2

FIG. 10 illustrates a plan configuration of a main part of a light emitting device (light emitting device 10B) according to a modification example 2 of the forgoing embodiment. In the light emitting device 10B, the reflection wall 20 surrounds the light emitting element 12 in a circular shape in plan view. In other words, the light emitting device 10B includes the segment Sg having a planar shape of a circle. Otherwise, the light emitting device 10B has similar configurations to those of the light emitting device 10 of the forgoing embodiment, and has similar workings and effects as well.

The planar shape of the segment Sg may be any shape insofar as produces the effects of the technology. For example, a honeycomb structure illustrated in FIG. 11 may be also possible.

Modification Example 3

FIG. 12 illustrates a cross-sectional configuration of a main part of a light emitting device (light emitting device 10C) according to a modification example 3 of the forgoing embodiment. In the light emitting device 10C, a height of the reflection wall 20 varies within the single segment Sg. Specifically, the light emitting device 10C includes, within the single segment Sg, a low part 23 having a smaller height of a wall surface of the reflection wall 20, and a high part 24 having a larger height. Otherwise, the light emitting device 10B has similar configurations to those of the light emitting device 10 of the forgoing embodiment, and has similar workings and effects as well.

For example, the low part 23, the high part 24, and the low part 23 are provided in order from a close position to the light emitting element 12. In FIG. 12, illustrated is a case where the reflection wall 20 has the two different heights (in the low parts 23 and the high part 24) within the single segment Sg. However, the reflection wall 20 may have three or more different heights within the single segment Sg.

Application Example: Electronic Apparatus

Described below is an application example of the display device 1 as mentioned above to an electronic apparatus. Examples of the electronic apparatus include a television set, a medical monitor, a digital signage, a master monitor, a digital camera, a notebook personal computer, a mobile terminal device such as a mobile phone, and a video camera. In other words, the display device 1 as mentioned above is applicable to electronic apparatuses of all fields that display picture signals inputted from outside or picture signals generated inside as images or pictures.

FIGS. 13A and 13B illustrate an external appearance of a tablet type terminal device to which the display device 1 of the forgoing embodiment is applied. The tablet type terminal device includes, for example, a display unit 710 and a non-display unit 720. The display unit 710 includes the display device 1 of the forgoing embodiment.

Application Example: Lighting Device

FIG. 14 illustrates an external appearance of a lighting device to which the light emitting device 10 (or light emitting device 10A, 10B, or 10C, which is referred to as light emitting device 10 etc in the followings). The lighting device is a desk top lighting device including the light emitting device 10 etc of the forgoing embodiment. For example, a lighting unit 843 is attached to a post 842 provided on a base 841. The lighting unit 843 includes the light emitting device 10 etc according to the forgoing embodiment. The lighting unit 843 may have any shape, e.g., a shape of a tube illustrated in FIG. 14 and a shape of a curved surface illustrated in FIG. 15.

The light emitting device 10 et cetera may be applied to an interior lighting device as illustrated in FIG. 16. In the lighting device, a lighting unit 844 includes the light emitting device 10 etc as mentioned above. The lighting units 844 in an appropriate number are arranged on a ceiling 850A of a building at appropriate intervals. It is to be noted that the lighting units 844 may be disposed at any locations according to their use, not only on the ceiling 850A but also a wall 850B or a floor (undepicted).

In the lighting devices, illumination is provided by light from the light emitting device 10 etc. Here, as described in the forgoing embodiment, the light emitting device 10 etc having the high in-plane luminance uniformity is provided. Hence, it is possible to produce light of uniform luminance.

Although description has been made by giving the embodiment and the modification examples as mentioned above, the contents of the technology are not limited to the above-mentioned embodiment and may be modified in a variety of ways. For example, arrangement positions, shapes, or other features of the holder member, the bezel, and the rear casing described in the forgoing example embodiments are mere examples and non-limiting.

Moreover, sizes, size ratios, shapes, and other features of the constituent elements illustrated in the figures are mere examples, and the contents of the technology are not limited thereto.

Furthermore, in the forgoing example embodiments, described is the case where the light emitting elements 12 are LEDs. However, the light emitting elements 12 may include, for example, semiconductor lasers.

In addition, in the forgoing embodiment, description is made by giving specific examples of the configurations of, for example, the light emitting devices 10, 10A, 10B, and 10C, and the display device 1. However, they do not have to include all the constituent elements. Moreover, they may further include other constituent elements.

Moreover, materials and other properties of each of the constituent elements described in the forgoing embodiment are non-limiting, and other materials may be adopted.

It is to be noted that the effects described in this specification are mere examples and non-limiting, and there may be other effects.

The technology may have the following configurations.

(1)
A light emitting device, including:
  a light emitting element;
  a reflection wall that surrounds the light emitting element; and
  a diffusion reflection sheet that includes a plurality of particles and permits entrance of emitted light from the light emitting element and reflected light from the reflection wall.

(2)
The light emitting device according to (1), in which at least some of the plurality of the particles have a hollow structure.

(3)
The light emitting device according to (1) or (2), in which the plurality of the particles include hollow silica.

(4)
The light emitting device according to any one of (1) to (3), in which the reflection wall includes a shaped reflection sheet.

(5)
The light emitting device according to any one of (1) to (4), in which the light emitting element is an LED (Light Emitting Diode).

(6)
The light emitting device according to (5), further including a light source substrate on which the light emitting element is disposed,
  in which the diffusion reflection sheet is disposed to face the light source substrate.

(7)
The light emitting device according to (6), further including a wavelength conversion sheet that faces the light source substrate,
  in which the diffusion reflection sheet is disposed between the wavelength conversion sheet and the light source substrate.

(8)
The light emitting device according to (6) or (7), in which at least a portion of the reflection wall is disposed, between the light source substrate and the diffusion reflection sheet, in a direction crossing the light source substrate.

(9)
The light emitting device according to (8), in which the light emitting element is of a side emission type.

(10)
The light emitting device according to any one of (5) to (9), in which the light emitting element is devoid of a package and a lens.

(11)
The light emitting device according to any one of (5) to (9), in which the light emitting device includes a covering material that covers the light emitting element.

(12)
The light emitting device according to any one of (1) to (11), in which the light emitting device includes a plurality of segments partitioned by the reflection wall.

(13)
The light emitting device according to any one of (1) to (12), in which the plurality of the particles have a predetermined distribution pattern from segment to segment.

(14)
The light emitting device according to (13), in which in the distribution pattern, the plurality of the particles is densified directly over the light emitting element.

(15)
The light emitting device according to any one of (12) to (14), in which a height of the reflection wall varies within a single one of the segments.

(16)
The light emitting device according to any one of (1) to (15), in which the light emitting element emits light of a blue wavelength range.

(17)
A display device provided with a display panel and a light emitting device that illuminates the display panel,
  the light emitting device including:
  a light emitting element;
  a reflection wall that surrounds the light emitting element; and
  a diffusion reflection sheet that includes a plurality of particles and permits entrance of emitted light from the light emitting element and reflected light from the reflection wall.

(18)
A lighting device provided with a light emitting device,
  the light emitting device including:
  a light emitting element;
  a reflection wall that surrounds the light emitting element; and
  a diffusion reflection sheet that includes a plurality of particles and permits entrance of emitted light from the light emitting element and reflected light from the reflection wall.

This application claims the benefit of Japanese Priority Patent Application JP2016-198773 filed with the Japan Patent Office on Oct. 7, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A light emitting device, comprising:
  a light emitting element comprising an LED (Light Emitting Diode);
  a light source substrate having a surface on which the light emitting element is disposed;
  a covering material that covers the light emitting element, the covering material having a refractive index between a refractive index of the light emitting element and a refractive index of air;

a reflection wall that surrounds the light emitting element and is in contact with the surface of the light source substrate;

a wavelength conversion sheet that faces the light source substrate;

a diffusion reflection sheet that is in contact with the reflection wall and includes a plurality of particles and permits entrance of emitted light from the light emitting element and reflected light from the reflection wall, wherein the diffusion reflection sheet is formed as a single resin sheet printed with ink including the plurality of particles, and wherein the diffusion reflection sheet is disposed between the wavelength conversion sheet and the light source substrate; and an optical sheet provided between the diffusion reflection sheet and the wavelength conversion sheet.

2. The light emitting device according to claim 1, wherein at least some of the plurality of the particles have a hollow structure.

3. The light emitting device according to claim 1, wherein the plurality of the particles include hollow silica.

4. The light emitting device according to claim 1, wherein the reflection wall includes a shaped reflection sheet.

5. The light emitting device according to claim 1, wherein at least a portion of the reflection wall is disposed, between the light source substrate and the diffusion reflection sheet, in a direction crossing the light source substrate.

6. The light emitting device according to claim 5, wherein the light emitting element is of a side emission type.

7. The light emitting device according to claim 1, wherein the light emitting element is devoid of a package and a lens.

8. The light emitting device according to claim 1, wherein the light emitting device includes a plurality of segments partitioned by the reflection wall.

9. The light emitting device according to claim 8, wherein the plurality of the particles have a predetermined distribution pattern from segment to segment.

10. The light emitting device according to claim 9, wherein in the distribution pattern, the plurality of the particles is densified directly over the light emitting element.

11. The light emitting device according to claim 8, wherein a height of the reflection wall varies within a single one of the segments.

12. The light emitting device according to claim 1, wherein the light emitting element emits light of a blue wavelength range.

13. A display device provided with a display panel and a light emitting device that illuminates the display panel, the light emitting device comprising:

a light emitting element comprising an LED (Light Emitting Diode);

a light source substrate having a surface on which the light emitting element is disposed;

a covering material that covers the light emitting element, the covering material having a refractive index between a refractive index of the light emitting element and a refractive index of air;

a reflection wall that surrounds the light emitting element and is in contact with the surface of the light source substrate;

a wavelength conversion sheet that faces the light source substrate;

a diffusion reflection sheet that is in contact with the reflection wall and includes a plurality of particles and permits entrance of emitted light from the light emitting element and reflected light from the reflection wall, wherein the diffusion reflection sheet is formed as a single resin sheet printed with ink including the plurality of particles, and wherein the diffusion reflection sheet is disposed between the wavelength conversion sheet and the light source substrate; and an optical sheet provided between the diffusion reflection sheet and the wavelength conversion sheet.

14. The display device according to claim 13, wherein the light emitting device includes a plurality of segments partitioned by the reflection wall, and wherein the plurality of the particles have a distribution pattern from segment to segment.

15. A lighting device provided with a light emitting device, the light emitting device comprising:

a light emitting element comprising an LED (Light Emitting Diode);

a light source substrate having a surface on which the light emitting element is disposed;

a covering material that covers the light emitting element, the covering material having a refractive index between a refractive index of the light emitting element and a refractive index of air;

a reflection wall that surrounds the light emitting element and is in contact with the surface of the light source substrate;

a wavelength conversion sheet that faces the light source substrate;

a diffusion reflection sheet that is in contact with the reflection wall and includes a plurality of particles and permits entrance of emitted light from the light emitting element and reflected light from the reflection wall, wherein the diffusion reflection sheet is formed as a single resin sheet printed with ink including the plurality of particles, and wherein the diffusion reflection sheet is disposed between the wavelength conversion sheet and the light source substrate; and an optical sheet provided between the diffusion reflection sheet and the wavelength conversion sheet.

16. The lighting device according to claim 15, wherein the plurality of the particles have a distribution pattern in which the plurality of the particles is densified directly over the light emitting element.

* * * * *